United States Patent
Schmidt

(10) Patent No.: US 9,082,843 B2
(45) Date of Patent: Jul. 14, 2015

(54) SEMICONDUCTOR DEVICE WITH STEP-SHAPED EDGE TERMINATION, AND METHOD FOR MANUFACTURING A SEMICONDUCTOR DEVICE

(71) Applicant: Infineon Technologies AG, Neubiberg (DE)

(72) Inventor: Gerhard Schmidt, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 221 days.

(21) Appl. No.: 13/713,867

(22) Filed: Dec. 13, 2012

(65) Prior Publication Data

US 2014/0167143 A1    Jun. 19, 2014

(51) Int. Cl.

| H01L 29/66 | (2006.01) |
|---|---|
| H01L 29/78 | (2006.01) |
| H01L 29/861 | (2006.01) |
| H01L 29/06 | (2006.01) |
| H01L 29/739 | (2006.01) |
| H01L 21/265 | (2006.01) |
| H01L 29/20 | (2006.01) |

(52) U.S. Cl.
CPC ........ *H01L 29/7802* (2013.01); *H01L 29/0611* (2013.01); *H01L 29/0649* (2013.01); *H01L 29/0661* (2013.01); *H01L 29/66712* (2013.01); *H01L 29/7395* (2013.01); *H01L 29/861* (2013.01); *H01L 21/26586* (2013.01); *H01L 29/2003* (2013.01)

(58) Field of Classification Search
USPC ....................................................... 257/329
See application file for complete search history.

(56) References Cited

U.S. PATENT DOCUMENTS

| 6,242,784 | B1 | 6/2001 | Zeng et al. |
|---|---|---|---|
| 6,635,944 | B2 | 10/2003 | Stoisiek |
| 8,093,676 | B2 | 1/2012 | Schmidt |
| 2002/0053718 | A1 | 5/2002 | Stoisiek |
| 2009/0008723 | A1* | 1/2009 | Schmidt ........................ 257/409 |

(Continued)

FOREIGN PATENT DOCUMENTS

| DE | 102007030755 B3 | 2/2009 |
|---|---|---|
| DE | 102011054825 A1 | 5/2012 |

(Continued)

OTHER PUBLICATIONS

K. Seto et al. "Universal Trench Edge Termination Design." Proceedings of the 2012 24th International Symposium on Power Semiconductor Devices and ICs, Jun. 3-7, 2012. IEEE. p. 161-164.

*Primary Examiner* — Daniel Whalen
(74) *Attorney, Agent, or Firm* — Murphy, Bilak & Homiller, PLLC

(57) ABSTRACT

A semiconductor body has a first side, second side, lateral edge, active area, edge termination between the active area and the lateral edge, and drift region of a first conductivity type. The edge termination includes a step formed in the semiconductor body between the first side and the lateral edge. The step includes a lateral surface extending up to the first side and a bottom surface extending up to the lateral edge. A first doping zone of a second conductivity type is formed in the semiconductor body along the lateral surface of the step and forms a pn-junction with the drift region. A second doping zone of the first conductivity type is formed in the semiconductor body at least along a part of the bottom surface of the step and extends up to the lateral edge, wherein the second doping zone is in contact with the drift region.

16 Claims, 11 Drawing Sheets

(56) References Cited

U.S. PATENT DOCUMENTS

2012/0104537 A1 5/2012 Schmidt et al.
2012/0306046 A1* 12/2012 Schmidt ................... 257/506

FOREIGN PATENT DOCUMENTS

| DE | 102012209429 A1 | 12/2012 |
| WO | 0038242 A1 | 6/2000 |

\* cited by examiner

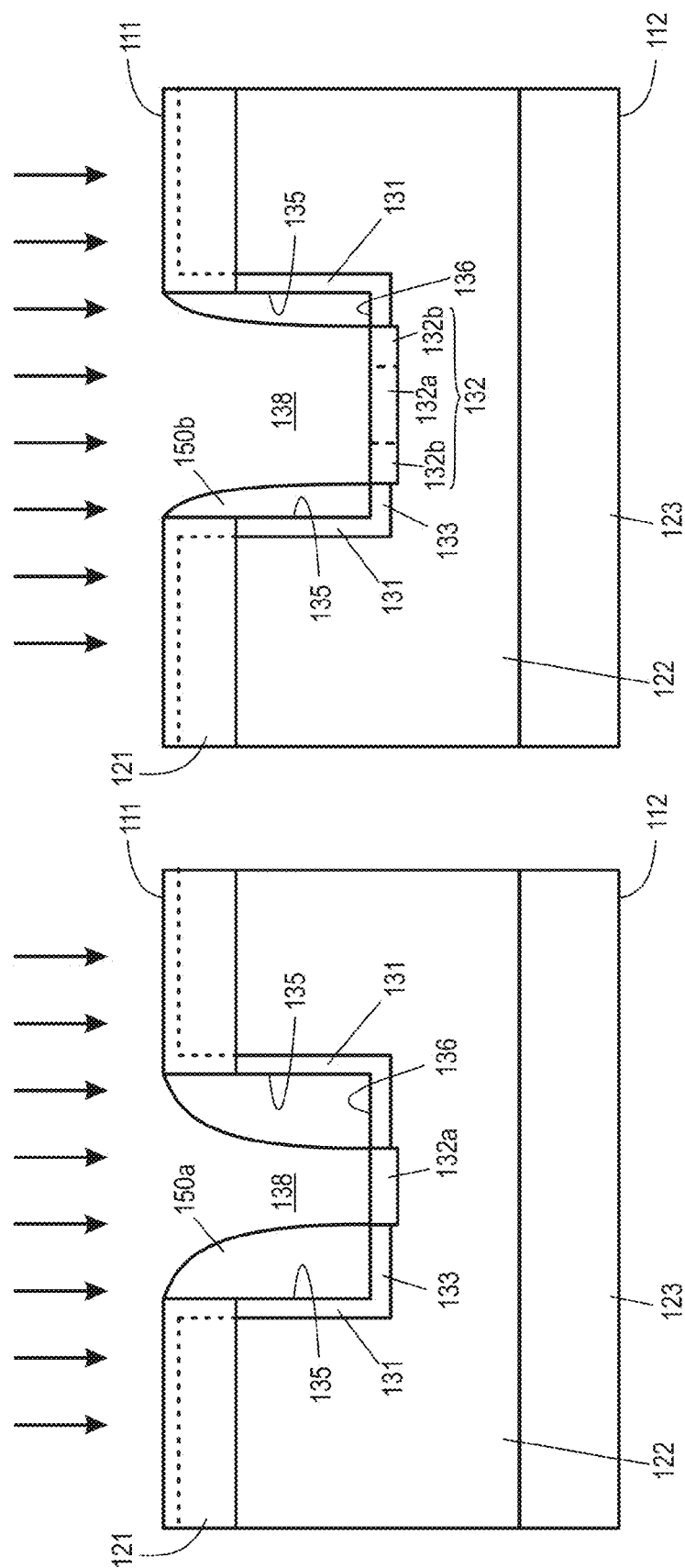

SEMICONDUCTOR DEVICE WITH STEP-SHAPED EDGE TERMINATION, AND METHOD FOR MANUFACTURING A SEMICONDUCTOR DEVICE

TECHNICAL FIELD

Embodiments described herein relate to semiconductor devices with an edge termination having a channel stopper at the bottom of a trench and methods for manufacturing such semiconductor devices.

BACKGROUND

High-voltage devices need a reliable edge termination at the edge of the die to ensure that the devices can reliably block the high voltage. The edge termination shall relieve the electric field strength between the active area and the kerf or sawing edge and shall prevent any excessive field increase at the kerf edge. Typically, the edge terminations are adapted to shape the electrical field such that the potential lines are diverted towards the surface of the device without any strong bending or crowding of the potential lines in order to prevent avalanche generation in the semiconductor substrate or dielectric breakdown in the passivation layers. Critical topological areas in the edge termination structure are steps and edges where peak field strength of up to several MV/cm might be generated.

Planar edge terminations, which are a common technique to reduce the electric field strength, employs field plates arranged on the top surface of the devices or a varying lateral doping to adapt the electric field strength at the surface of the semiconductor device. The space required for planar edge terminations is high to prevent any local increase of the electrical field strength above the critical value for avalanche breakdown. To keep the electrical potential line curvature sufficiently small, a lateral width of about 200-250 µm is needed for an edge termination zone of a device capable for blocking 600 V. For a 6.5 kV blocking voltage, the required lateral width increases to about 2000 µm.

Another approach uses the so-called mesa edge termination where the electrical field strength relief at least partially occurs within the vertical depth of the device to reduce the required lateral space. Mesa edge termination zones may include trenches or bevelled pn-junctions. Raw techniques such as laser processing, lapping, grinding or sand blasting are needed to produce the desired shape of the edge termination zone which techniques are often unsuitable for wafer mass production.

In view of the above, there is a need for improvement.

SUMMARY

According to an embodiment, a semiconductor device includes a semiconductor body having a first side, a second side, a lateral edge delimiting the semiconductor body in a lateral direction, an active area, and an edge termination arranged between the active area and the lateral edge. A drift region of a first conductivity type is formed in the semiconductor body. The edge termination includes a step which is formed in the semiconductor body between the first side of the semiconductor body and the lateral edge. The step includes a lateral surface extending up to the first side of the semiconductor body and a bottom surface extending up to the lateral edge of the semiconductor body. A first doping zone of a second conductivity type is formed in the semiconductor body along the lateral surface of the step and forms a pn-junction with the drift region. A second doping zone of the first conductivity type is formed in the semiconductor body at least along a part of the bottom surface of the step and extends up to the lateral edge of the semiconductor body, wherein the second doping zone is in contact with the drift region.

According to an embodiment, a semiconductor device includes a semiconductor body having a first side, a second side, a lateral edge delimiting the semiconductor body in a lateral direction, an active area, and an edge termination arranged between the active area and the lateral edge. A drift region of a first conductivity type is formed in the semiconductor body. The edge termination includes a step which is formed in the semiconductor body between the first side of the semiconductor body and the lateral edge. The step includes a lateral surface extending up to the first side of the semiconductor body and a bottom surface extending up to the lateral edge of the semiconductor body. A first doping zone of a second conductivity type is formed in the semiconductor body at the lateral surface of the step and forms a pn-junction with the drift region. A second doping zone of the first conductivity type is formed in the semiconductor body along a part of the bottom surface of the step and extends up to the lateral edge of the semiconductor body, wherein the second doping zone is in contact with the drift region. A third doping zone of the second conductivity is formed in the semiconductor body at the bottom surface of the step and extends up to the lateral surface of the step, wherein the third doping zone forms a pn-junction with the drift region and adjoins the first doping zone. The third doping zone has a doping concentration which is higher than a doping concentration of the first doping zone. An insulating material fills the step, covers the first, second and third doping zone and extends up to the lateral edge of the semiconductor body.

According to an embodiment, a method for manufacturing a semiconductor device includes providing a semiconductor substrate having a first side, a second side, a plurality of laterally spaced semiconductor devices integrated into the semiconductor substrate, and a drift region of a first conductivity type; forming, at the first side of the semiconductor substrate, trenches in the semiconductor substrate between laterally adjacent semiconductor devices, each of the trenches including two sidewalls and a bottom; forming first doping zones of a second conductivity type in the semiconductor substrate at least along the sidewalls of the trenches, wherein the first doping zones form pn-junctions with the drift region; forming second doping zones of the first conductivity type in the semiconductor substrate at least along a part of the bottom of the trenches, wherein the second doping zones adjoin the drift region; and cutting the semiconductor substrate along the second doping zones in the trenches to separate the semiconductor devices.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIGS. 5 to 11 illustrate sequences of a process for manufacturing a semiconductor device having an edge termination with a channel stopper at a bottom of a trench according to an embodiment;

DETAILED DESCRIPTION

In the following Detailed Description, reference is made to the accompanying drawings, which form a part hereof, and in which are shown by way of illustration specific embodiments in which the invention may be practiced. In this regard, directional terminology, such as "top", "bottom", "front", "back", "leading", "trailing" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

The term "lateral" as used in this specification intends to describe an orientation parallel to the main surface of a semiconductor substrate.

The term "vertical" as used in this specification intends to describe an orientation, which is arranged perpendicular to the main surface of the semiconductor substrate.

In this specification, a second surface of a semiconductor substrate or body is considered to be formed by the lower or back-side surface while a first surface is considered to be formed by the upper, front or main surface of the semiconductor substrate or body. The terms "above" and "below" as used in this specification therefore describe a relative location of a structural feature to another structural feature with consideration of this orientation.

When referring to semiconductor devices, at least two-terminal devices are meant, an example is a diode. Semiconductor devices can also be three-terminal devices such as a field-effect transistors (FET), insulated gate bipolar transistors (IGBT), junction field effect transistors (JFET), and thyristors to name a few. The semiconductor devices can also include more than three terminals. According to an embodiment, semiconductor devices are power devices. Integrated circuits include a plurality of integrated devices.

Figure 1:
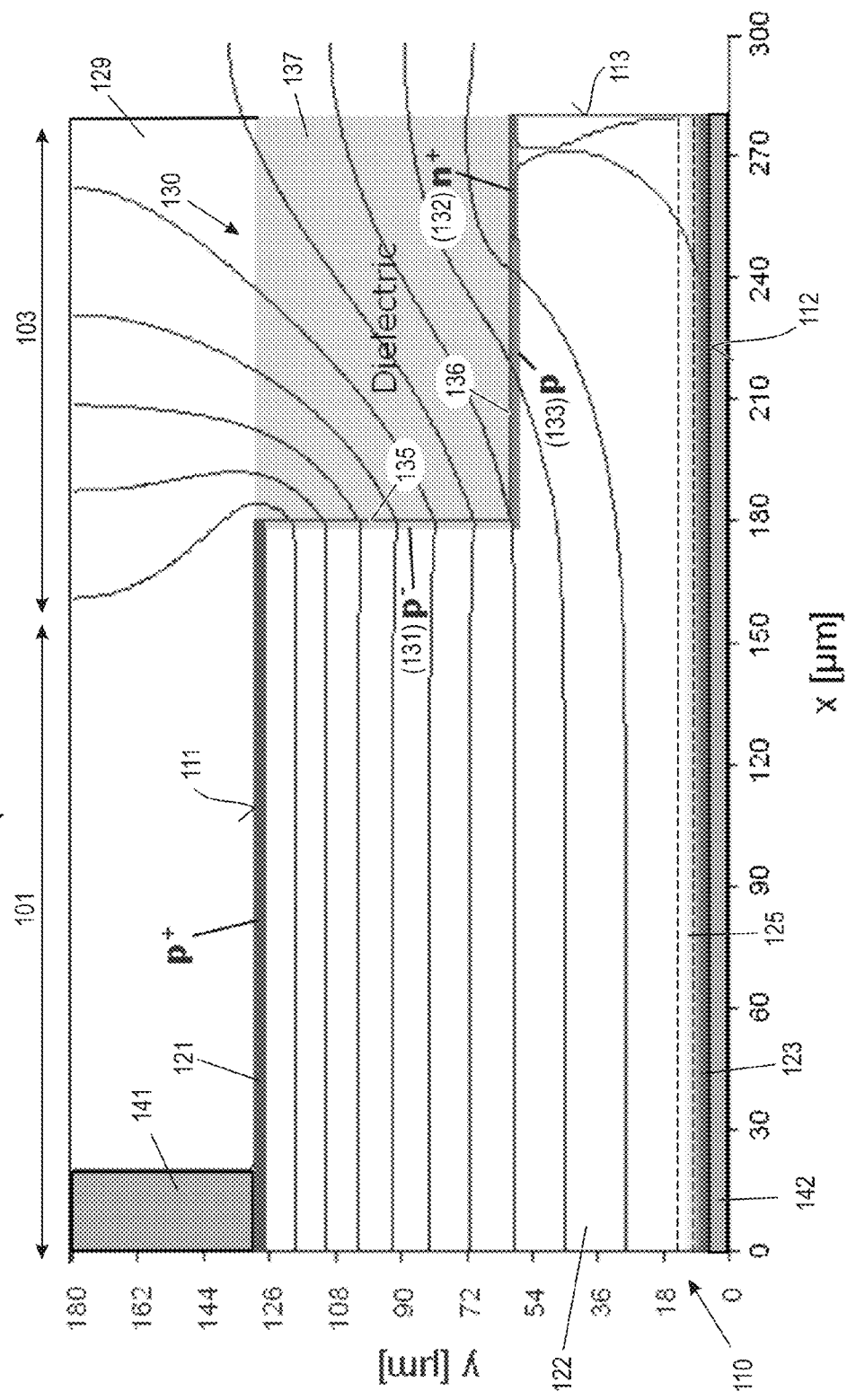
FIG. 1 illustrates the distribution of the electrical potential lines of a semiconductor device having an edge termination with a channel stopper at a bottom of a trench according to an embodiment.

With reference to FIG. 1, a first embodiment of a semiconductor device 100a is described. The semiconductor device 100a includes a semiconductor body 110 of a semiconductor material such as Si, SiC, GaN or GaAs. The semiconductor device 110a is typically a vertical semiconductor device. Furthermore, semiconductor body 110 of the semiconductor device 100a is typically a thin material.

The semiconductor body 110 includes a first side 111, a second side 112 opposite the first side 111, a lateral edge 113 delimiting the semiconductor body 110 in a lateral direction, an active area 101, and an edge termination 103 arranged between the active area 101 and the lateral edge 113. According to an embodiment, which will be described further below, the edge termination 103 laterally completely surrounds the active area 101 and is arranged in the peripheral area of the device 100a.

A first doping region 121 of a second conductivity type is formed at the first side 111 of the semiconductor body 110. A second doping region 122 of a first conductivity type is formed in the semiconductor body 110. The first conductivity type is here of n-type and the second conductivity type of p-type. The person skilled in the art will appreciate that the first conductivity type can also be p-type while the second conductivity type can be n-type.

According to an embodiment, the first doping region 121 forms an anode region of a power diode while the second doping region 122 forms a drift region of the power diode. According to another embodiment, the first doping region 121 forms a body region of a power-FET or IGBT while the second doping region 122 forms a drift region of the power-FET or IGBT. In the following, reference is made to a power diode. However, the same applies to power-FETs such as SIPMOS-transistors, DMOS-transistors and transistors having a compensation area (so-called COOLMOS), and IGBTs. In those devices, the first and second doping regions 121, 122 form the main pn-junction of the respective device. The main pn-junction is mainly parallel to the first side 111, i.e. its runs parallel to the first side 111, and is arranged in the active area 101. The edge termination 103 is arranged laterally adjacent to the active area 101. The second doping region 122 is referred to as drift region hereinafter.

The first doping region 121 forms here a heavily p-doped anode region of the power diode. A third doping region 123 of the first conductivity type is formed at the second side 112 of the semiconductor body 110. The third doping region 123 is of the same doping type as the drift region 122, typically has a higher doping concentration than the drift region 122, and forms a cathode region of the power diode.

The edge termination 103 includes a step 130 which is formed in the semiconductor body 110 between the first side 111 of the semiconductor body 110 and the lateral edge 113. To be more specific, the step 130 is formed in this embodiment along the region where the lateral edge 113 meets the first side 111 of the semiconductor body 110.

The step 130 includes a lateral surface 135, which extends up to the first side 111 of the semiconductor body 110, and a bottom surface 136, which extends up to the lateral edge 113 of the semiconductor body. A first doping zone 131 of the second conductivity type is formed in the semiconductor body 110 along the lateral surface 135 of the step 130 and forms a pn-junction with the drift region 122. A second doping zone 132 of the first conductivity type is formed in the semiconductor body 110 at least along a part of the bottom surface 136 of the step 130 and extends up to the lateral edge 113 of the semiconductor body 110. The second doping zone 132 is in contact with the drift region 122.

A third doping zone 133 of the second conductivity is formed in the semiconductor body 110 along a part of the bottom surface 136 of the step 130 and extends up to the lateral surface 135 of the step 130. The third doping zone 133 forms a pn-junction with the drift region 121 and adjoins the first doping zone 131.

The first doping region 121 extends in this embodiment up to and adjoins the first doping zone 131 so that the drift region 122 is not exposed at the first side 111 of the semiconductor body 110. A further pn-junction is formed between the first doping zone 131 and the drift region 122 and extends substantially vertically and parallel to the lateral surface 135 of the step 130. The further pn-junction, which extends deeper into the semiconductor body 110 than the main pn-junction between the drift region 122 and the first doping region 121, is part of the edge termination 103. At the bottom of the step 130, the further pn-junction passes into a horizontal pn-junction between the third doping zone 133 and the drift region 122. Hence, the corner between the lateral surface 135 and the bottom surface 136 of the step 130 is surrounded by the further pn-junction.

The third doping zone 133 may have a doping concentration which is higher than a doping concentration of the first doping zone 131.

An insulating material 137 fills the step 130 and laterally extends up to the lateral edge 113 of the semiconductor body 110. Furthermore, the insulating material 137 vertically extends up to the first side 111 of the semiconductor body 110.

The edge termination 103 as illustrated in FIG. 1 is a partially vertical edge termination with a partially vertical pn-junction. The bottom surface 136 of the step 130 is disposed from the second side 112 and does not reach the third doping region 123. The drift region 121 has a given vertical extension between the first doping region 121 and the third doping region 123. The step 130 vertically extends from the first side 111 of the semiconductor body 110 to a depth of about half of the vertical extension of the drift region 121.

According to an embodiment, the first doping region 121 is in ohmic contact with a first metallization 141 arranged on the first side 111 of the semiconductor body 110. The first metallization 141 forms, in the present embodiment, the anode electrode of the power diode. The third doping region 123 is in ohmic contact with a second metallization 142 arranged on the second side 112 of the semiconductor body 110. The second metallization 142 forms, in the present embodiment, the cathode electrode of the power diode.

As illustrated in FIG. 1, the electrical potential is partially diverted in a vertical direction by the edge termination 103 without completely diverting the electrical field. The course of the electrical potential lines is simulated on the basis of the parameters given below. The invention, however, is not limited to these parameters.

The power diode as illustrated in FIG. 1 has been designed for a rated blocking voltage of 1200 V. The semiconductor material of the semiconductor body 110 is n-doped Si having a specific resistance of about 53 Ω*cm and a vertical thickness of about 125 µm. The first doping region 121 forms a heavily p-doped anode region of the power diode and has a doping concentration at the first side 111 (an upper surface of the semiconductor body 110) of about $1 \cdot 10^{17}$ cm$^{-3}$. The first doping region 121 vertically extends into the semiconductor body 110 by about 6 µm so that main pn-junction between the anode region 121 and the drift region 122 is spaced apart from the first side 111 by about 6 µm.

The third doping region 123 forms a heavily n-doped emitter region of the power diode and has a doping concentration at the second side 112 of the semiconductor body 110 (lower surface of the semiconductor body 110) of about $3.5 \cdot 10^{15}$ cm$^{-3}$ and extends, from the second side 112 of the semiconductor body 110, into the semiconductor body 110 by about 2 µm. An optional n-doped field stop region 125 is arranged between the emitter region 123 and the drift region 122. The field stop region 125 has a vertical extension up to a depth from the second side 112 of the semiconductor body 110 of about 15 µm and a peak doping concentration of about $1.3 \cdot 10^{14}$ cm$^{-3}$.

The first doping zone 131 at the sidewall surface 135 of the step 130 was formed using a doping dose of about $2.5 \cdot 10^{11}$ cm$^{-2}$, whereas for the formation of the third doping zone 133 at the bottom surface 136 of the step 130 a doping dose of about $5 \cdot 10^{11}$ cm$^{-2}$ was used. Hence, the third doping zone 133 has a doping concentration which is about 2-times higher than the doping concentration of the first doping zone 131. The second doping zone 132 at the bottom surface 136 of the step 130 was formed using a doping dose of about $1 \cdot 10^{15}$ cm$^{-2}$, i.e. the doping concentration of the second doping zone 132 is significantly higher than the doping concentration of the first doping zone 131 and the third doping zone 133, respectively. The second doping zone 132 forms here a so-called channel stopper and has a lateral extension from the lateral edge 113 along the bottom surface 136 of about 30 µm. This ensures that the electrical potential lines, as indicated by the lines in FIG. 1, at the anode region 133 are reliably bent back into the semiconductor body 110.

The doping dose for the second doping zone 132 should be higher than the breakdown charge of the semiconductor material of the semiconductor body 110. In case of Si, the breakdown charge is about $1.6 \cdot 10^{12}$ cm$^{-2}$, hence, the previously described doping charge for the second doping zone 132 is sufficiently higher than the Si breakdown charge.

The second doping zone 132 can extend, in a vertical direction, from the bottom surface 136 into the semiconductor body 110 to a depth between about 0.1 µm to about 5 µm depending on the thermal budget of the semiconductor device 100a. Particularly when using rapid annealing processes such as LTA (Laser Thermal Annealing) or RTA (Rapid Thermal Annealing) the second doping zone 132 can be formed as a shallow doping zone.

The insulating material 137 has a relative dielectric constant ∈ of about 2 to about 8. In the embodiment of FIG. 1, the insulating material 137 has a relative dielectric constant ∈ of about 3.9, which is a typical value.

As can be gathered from FIG. 1, the electrical potential lines are diverted upward and guided through the insulating material 137 either vertically or laterally. In any case, the electrical potential lines "leave" the semiconductor body 110 through the step 130 so that the semiconductor material below the step 130 remains substantially field-free at the outer edge.

A power diode having a structure as illustrated in FIG. 1 and with the previously described parameters has an actual blocking voltage of about 1614 V which approximately corresponds to 90% of the bulk breakdown voltage of the used semiconductor material. This is sufficient for many applications.

The edge termination 103 as described herein differs from conventional edge terminations, which uses a trench disposed from the lateral edge, in that the step 130 is formed at and extends up to the lateral edge 113. The space assumed by the edge termination 103 as described herein is significantly smaller than for conventional devices having a trench disposed from the lateral edge. In the present embodiment, the space needed is only about 90 µm to about 95 µm. This space is assumed mainly by the step 130 which has a lateral extension from the lateral edge 113 in to the semiconductor body 110 of about 90 µm to 95 µm.

For comparison, a conventional edge termination having a trench would need a space of about 130 µm with 60 µm for the lateral width of the trench and about 70 µm for the space between the trench and the lateral edge.

Furthermore, the second doping zone 132, which functions as channel stopper, is integrated into the bottom surface 136 of the step 130 unlike conventional edge terminations which have a channel stopper at the upper side of the device between the trench and the lateral edge.

Figure 5:
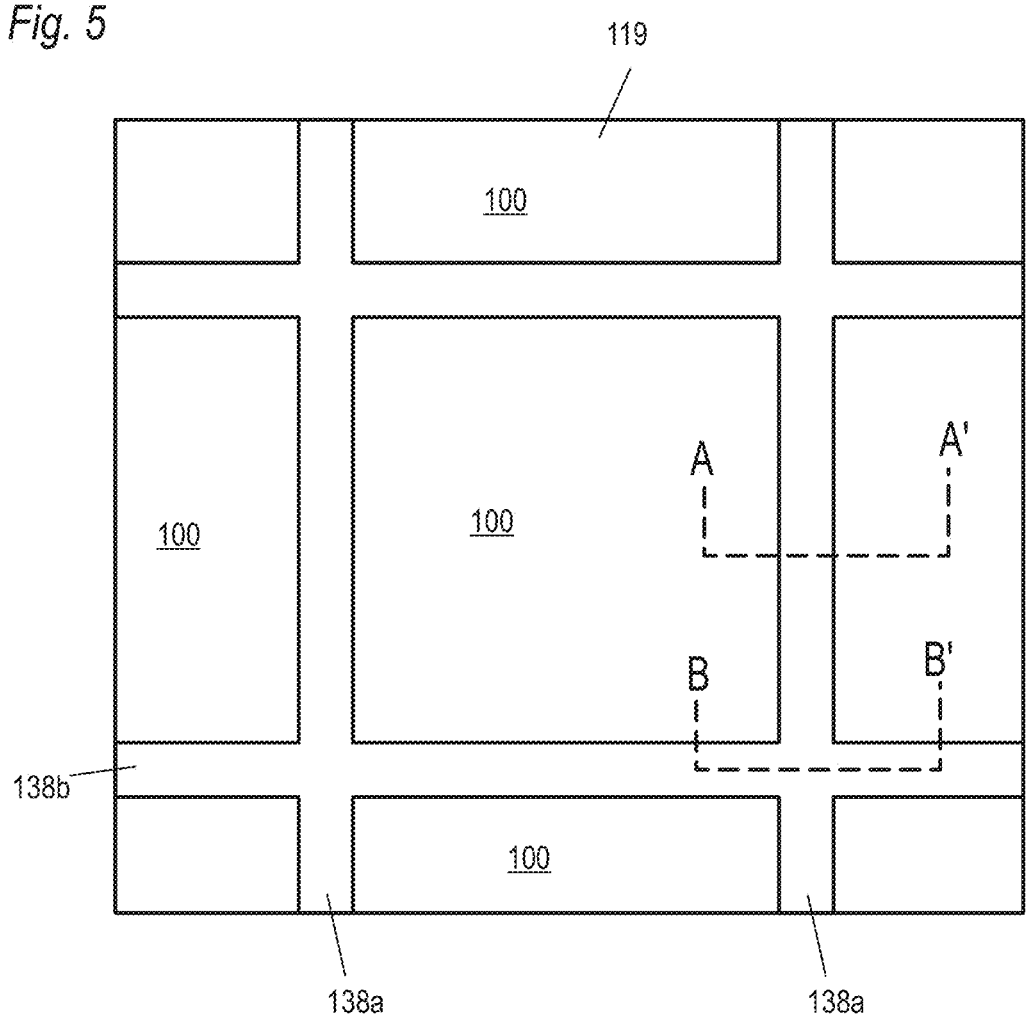
Figure 14:
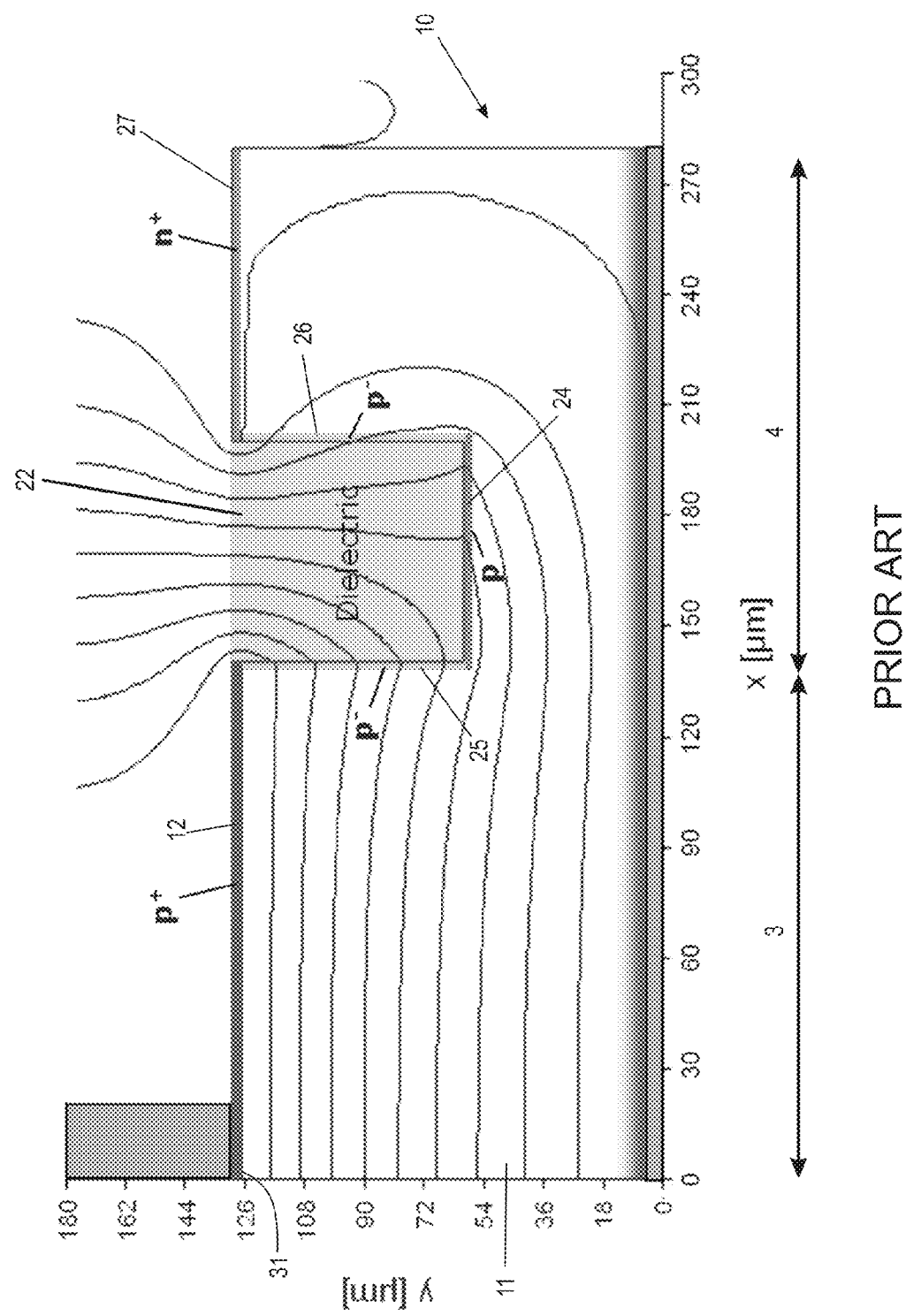
FIG. 14 illustrates the distribution of the electrical potential lines of a semiconductor device having a commonly known edge termination.

For comparison, a semiconductor device with a conventional edge termination 4 is illustrated in FIG. 14 which is based on FIG. 5 of US 2012/0104537 A1. The semiconductor device 100a includes a semiconductor material 10 having doping regions 11 and 12 which are of opposite conductivity type so that a pn-junction 31 is formed. The conventional edge termination 4 arranged outside of an inner region 3 of the semiconductor device 100a includes a trench 22 which is formed in the semiconductor material 10 and laterally spaced from an edge which is arranged here at the right side. The trench 22 is filled with a dielectric material. Doping zones 24, 25 and 26 are formed at the sidewalls and the bottom of the trench 22 and are of a conductivity type complementary to the conductivity type of the doping region 11. A channel stopper 27 is formed at the upper surface of the semiconductor material 10.

As can be gathered from FIG. 14, the electrical potential lines are bent upward. Furthermore, the electrical potential lines which are close to the lower side of the semiconductor material 10 are strongly bent back. To ensure that these electrical potential lines are sufficiently spaced apart from the right edge of the semiconductor material 10 and that a depletion zone formed during reverse mode does not reach as far as the right edge, the spacing between the trench 22 and the right edge must be sufficiently large. This increases the lateral width of the conventional edge termination 4.

Contrary thereto, the lateral width of the edge termination 103 can be reduced by forming the step 130 at the lateral edge 113 so that the electrical potential lines partially leaves the semiconductor device 100a at its lateral side above the bottom surface 136 of the step 130. This also reliefs the bending constraints for the electrical potential lines as can be seen by comparing FIGS. 1 and 14. In FIG. 1, the electrical potential lines are less bent in the region below the step 130 than in a region below the trench 22 in FIG. 14.

The second doping zone 132 at the bottom surface 136 of the step 130 ensures that the electrical potential lines are reliably bent upward and pass the second doping 132 at a side opposite the lateral edge 113 without bending them too strong. Since the second doping zone 132 (channel stopper) is formed at the bottom surface 136 of the step 130, some of the electrical potential lines laterally leave the semiconductor device 100a above the second doping zone 132. Hence, there remains an electrical field at a lateral region of the semiconductor device 100a. This is uncritical as the electrical field is restricted to the insulating material 137 due to the action of the second doping zone 132. The semiconductor material below the second doping zone 132 at the lateral edge 113, however, remains substantially field-free. During reverse mode, the second doping zone 132, although floating, is approximately at the electrical potential of the third doping region 123 due to the action of the second doping zone 132.

The first and third doping zones 131, 133 improve the blocking capabilities of the semiconductor device 100a. In addition to that, a higher doping concentration of the third doping zone 133 in comparison to the doping concentration of the first doping zone 131 allows a reduction of the vertical extension of the step 130 as seen in FIG. 1. As a consequence, the step 130 is formed only to a given depth leaving sufficient semiconductor material of the semiconductor body 110 below the step 130 for mechanical stability. This is beneficial during processing of the semiconductor device 100a and renders a highly doped substrate unnecessary. The edge termination 103 described herein is therefore compatible with thin wafer technologies.

Moreover, the higher doping concentration of the third doping zone 133 in comparison to the doping concentration of the first doping zone 131 provides more freedom in tailoring the geometrical relations of the step 130, particularly the lateral width and the depth of the step 130. Using a higher doping concentration for the third doping zone 133 allows, for example, reducing the lateral width of the step 130.

The semiconductor device 100a may also include a passivation layer 129 on the first side 111 of the semiconductor body 110. The passivation layer 129 covers the step 130 and partially extends over the first metallization 141.

Furthermore, a passivation region 170 can be formed along the lateral surface 135 and the bottom surface 136 of the step 130 between the semiconductor body 110 and the insulating material 137. The passivation region 170 can be comprised of silicon oxide, silicon nitride, carbon-based passivation materials such as diamond-like carbon layers, or combinations thereof.

Figure 2:
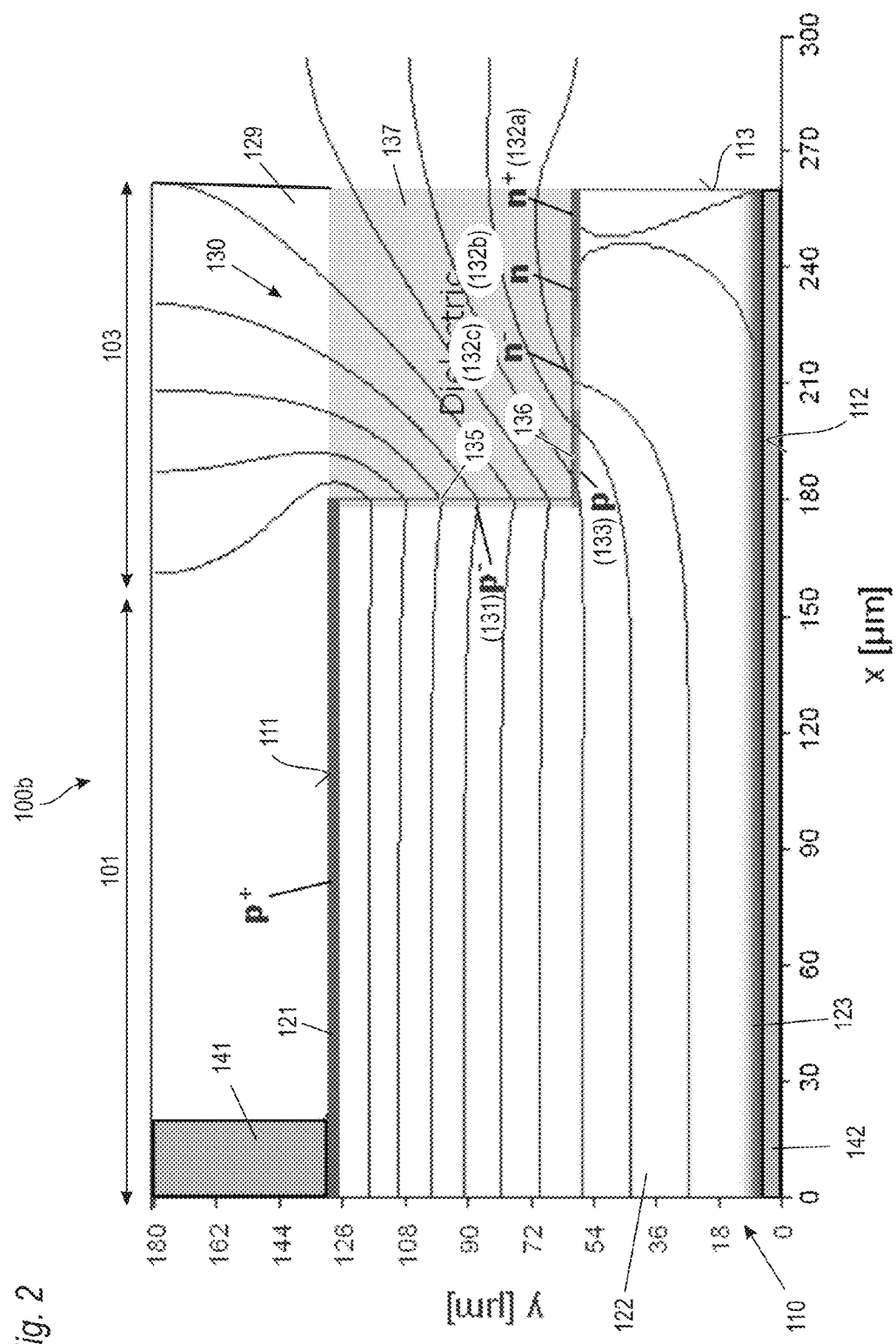
FIG. 2 illustrates the distribution of the electrical potential lines of a semiconductor device having an edge termination with a channel stopper with a laterally varying doping concentration at a bottom of a trench according to an embodiment.

With respect to FIG. 2, a modification of the semiconductor device 100a shown in FIG. 1 is described. The semiconductor device 100b of FIG. 2 has substantially the same structure as the semiconductor device 100a of FIG. 1 so that the description of the common features is omitted here. In contrast to FIG. 1, the semiconductor device 100b of FIG. 2 has, according to an embodiment, a second doping zone 132 with a laterally varying doping concentration. To be more specific, the second doping zone 132 includes three subzones 132a, 132b and 132c each having a different doping concentration. The relative doping concentration of these three subzones are indicated by "n$^-$", "n" and "n$^+$" so that the subzone 132a arranged at the lateral edge 113 has a higher doping concentration than the subzone 132c arranged adjacent to the third doping zone 133. The doping concentration of the second doping zone 132 therefore increases toward the lateral edge 113.

By providing the second doping zone 132 with a continuously or step-wise increasing doping concentration toward the lateral edge 113 it is possible to provide the edge termination 103 with blocking capabilities which are similar to the blocking capabilities of bulk semiconductor material where no bending of the electrical potential lines occurs. This also allows a further reduction of the lateral width of the edge termination 103.

A specific example to simulate the course of the electrical potential is illustrated in FIG. 2 where each of the three subzones 132a, 132b, 132c of the second doping zone 132 has a lateral width of about 20 µm. The doping dose for forming the subzone 132c was $3 \cdot 10^{11}$ cm$^{-2}$, for the subzone 132b was $1 \cdot 10^{12}$ cm$^{-2}$, and for the subzone 132a was $1 \cdot 10^{15}$ cm$^{-2}$. The doping dose for the first doping zone 131 was $5 \cdot 10^{11}$ cm$^{-2}$ and for the third doping zone 133 was $1 \cdot 10^{12}$ cm$^{-2}$. Using these parameters it was possible to reduce the lateral space needed for the edge termination 103 and the step 130 to about 80 µm. The simulation also revealed a breakdown in the bulk of the semiconductor body 110 at a blocking voltage of about 1795 V. Hence, the blocking capabilities are very good.

Figure 3:
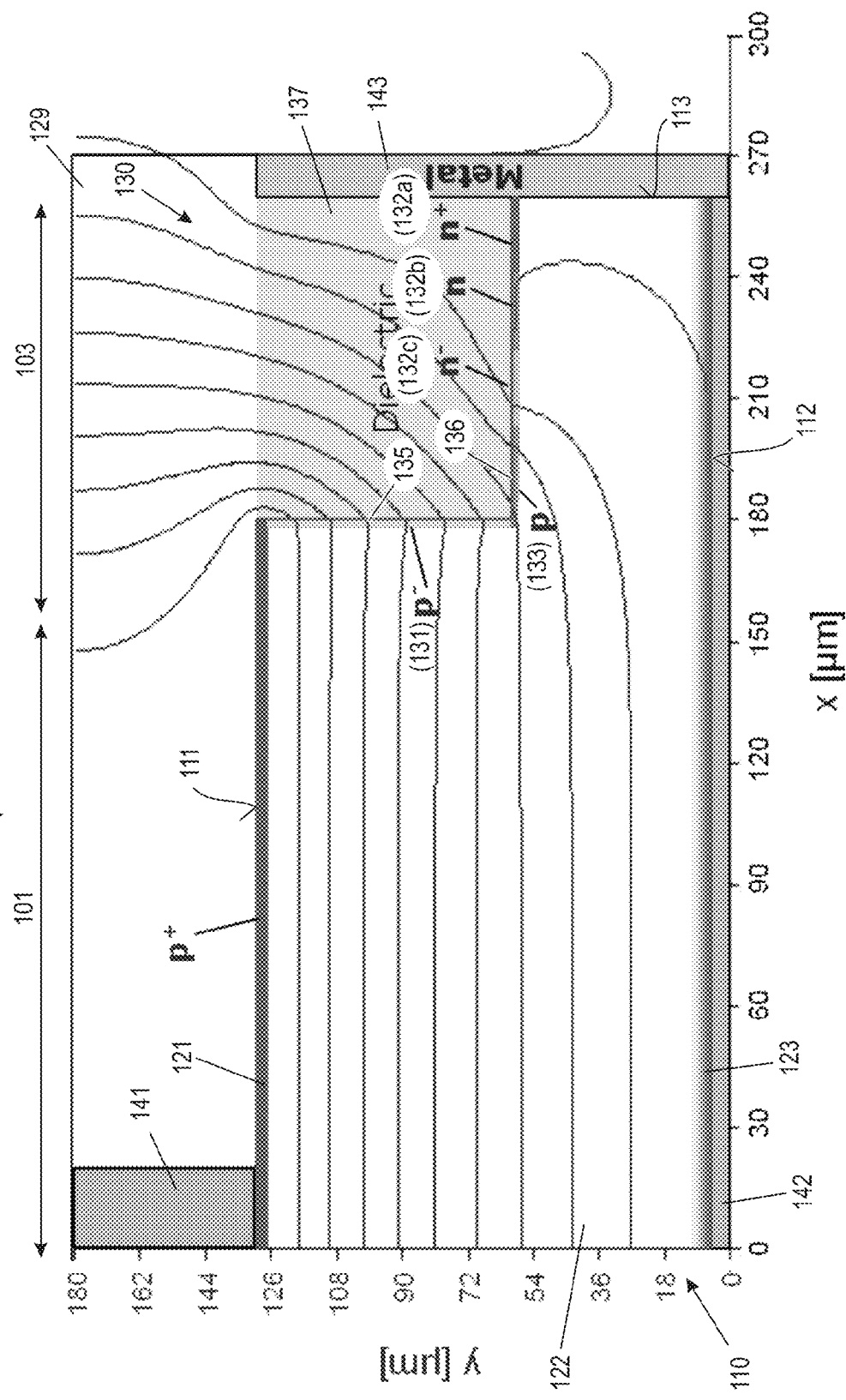
FIG. 3 illustrates the distribution of the electrical potential lines of a semiconductor device having an edge termination with a channel stopper with a laterally varying doping concentration at a bottom of a trench according to an embodiment.

The edge termination 103 as described herein is robust against metallic residues which may remain at the lateral edge 113 during processing of the device 100c, for example from soldering. This has been simulated by providing a metal layer 143 along the lateral edge 113 and the insulating material 137 as illustrated in FIG. 3. The remaining structure of the semiconductor device 100c in FIG. 3 corresponds to the structure of the semiconductor device 100b of FIG. 2. Assuming the same parameters as for the semiconductor device 100b of FIG. 2, the resulting blocking voltage at which a breakdown occurs is about 1751 V, i.e. only 2.5% less than the blocking voltage of a semiconductor device without such a metal layer 143 representing metal residues or crystal defects. Hence, the ruggedness of the device 100c can be maintained.

The semiconductor material along the lateral edge 113 is substantially field-free due to the presence of the second doping zone or channel stopper 132 at the bottom of the step 130. The metal layer 143 does not significantly affect the ruggedness of the semiconductor device 100c even when the electrical potential lines cannot not leave the semiconductor body 110 at the lateral side but are bent upward by the metal layer 143. The metal layer 143 can therefore be used as vertical field plate, which will be at the electrical potential of the second metallization 142.

Figure 4:
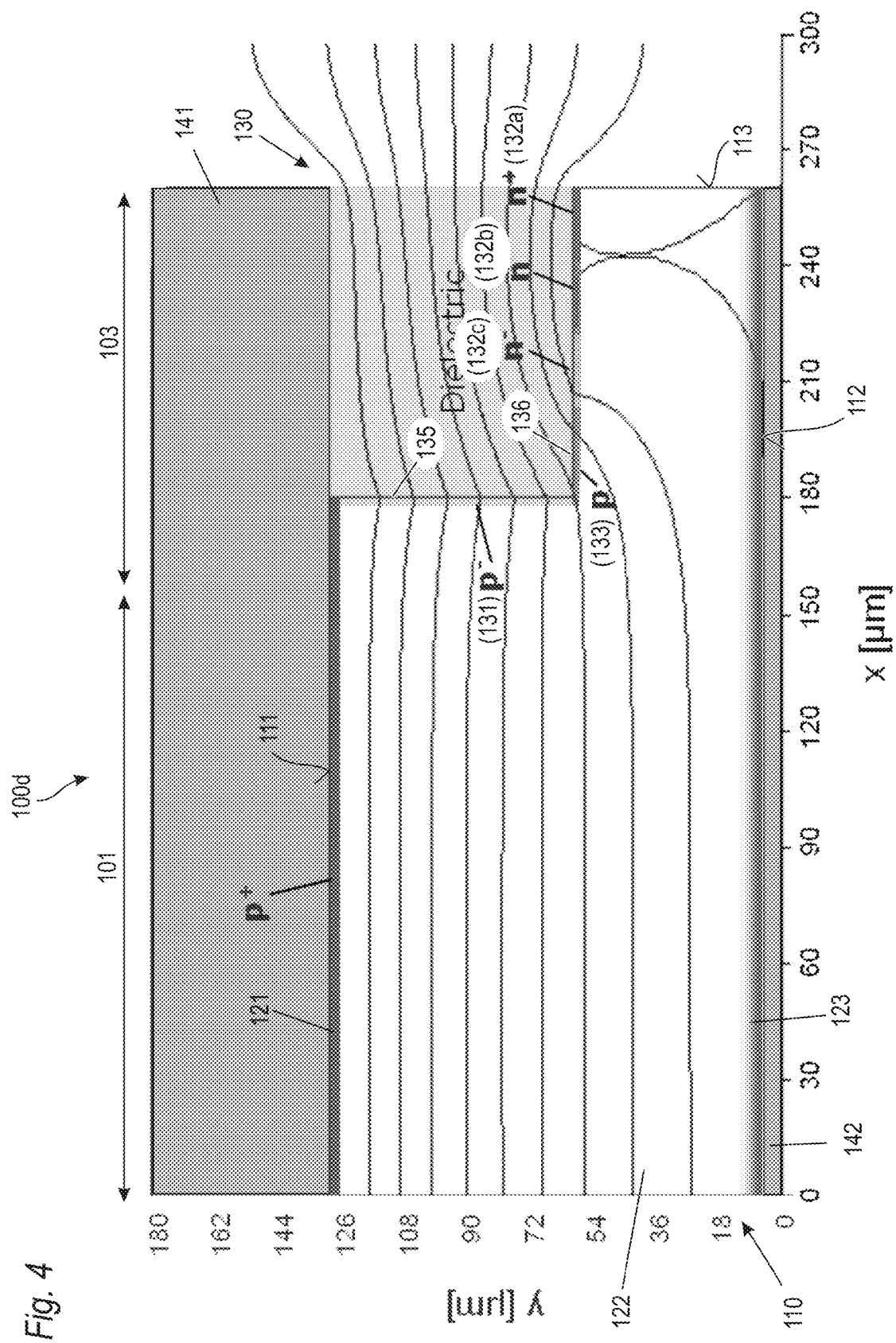
FIG. 4 illustrates the distribution of the electrical potential lines of a semiconductor device having an edge termination with a channel stopper at a bottom of a trench according to an embodiment.

On the other hand, when no metal layer 143 is formed and metal residues are reliably removed or when their formation can be reliably prevented, at least above the bottom 136 of the step 130, it is possible to extend the first metallization 141 up to the lateral edge 113 so that a lateral field plate is formed which is arranged on the first side 111 of the semiconductor body 110 and which at least partially covers the step 130. The first metallization 141 can form an anode metallization which is in ohmic contact with the first doping region 121 forming the anode region of the power diode. The first metallization 141 then also functions as lateral field plate above the edge termination 103. Such a lateral field plate causes the electrical potential lines to leave the semiconductor device 100d at its lateral edge 113 as illustrated in FIG. 4 which otherwise corresponds to the semiconductor device 100b of FIG. 2. As can be gathered from FIG. 4, the electrical potential lines remain substantially even when passing from the semiconductor body 110 through the first doping zone 131 into the insulating material 137. No strong bending occurs close to the lateral end of the main pn-junction between the first doping region 121 and the drift region 122. This is beneficial. As a consequence, the doping concentrations of the first doping zone 131 and the third doping zone 133 can be reduced. On the other hand, the doping concentration of the second doping zone 132 may be increased slightly. The lateral field plate will be at the electrical potential of the first metallization 141.

For a simulation based on the structure illustrated in FIG. 4, the following parameters were assumed: The doping dose for forming the subzone 132c was $6 \cdot 10^{11}$ cm$^{-2}$, for the subzone 132b was $1.8 \cdot 10^{12}$ cm$^{-2}$, and for the subzone 132a was $1 \cdot 10^{15}$ cm$^{-2}$. The doping dose for forming the first doping zone 131 was $4 \cdot 10^{11}$ cm$^{-2}$ and for the third doping zone 133 was $8 \cdot 10^{11}$ cm$^{-2}$. The resulting blocking voltage at which a breakdown occurs is about 1767 V which corresponds to about 98% of the blocking voltage of the bulk semiconductor material.

The lateral extension of the first metallization 141 up to the lateral edge 113 also improves the heat dissipation as both first and the second metallization 141, 142 can be used for heat dissipation. Hence, a double-sided cooling structure which covers both the first side and the second side 111, 112 of the semiconductor body 110 is possible.

According to an embodiment, the doping dose of the first doping zone 131 is between about $1*10^{11}$ cm$^{-2}$ and about $1*10^{12}$ cm$^{-2}$. According to an embodiment, the doping dose of the second doping zone 132 is between about $1*10^{13}$ cm$^{-2}$ and about $1*10^{16}$ cm$^{-2}$. According to an embodiment, the doping dose of the third doping zone 133 is between about $2*10^{11}$ cm$^{-2}$ and about $2*10^{12}$ cm$^{-2}$. According to an embodiment, the doping concentration of the third doping zone 133 is higher than the doping concentration of the first doping zone 131 by a factor between about 1.5 and about 3, particularly about 2.

According to an embodiment, the insulating material 137 is comprised of organic or inorganic polymers having a high electrical breakdown resistance and moisture resistance. Examples are cured epoxy resins such as SU8, silicones, spin-on-glasses, polyimides, parylene, polynorbonene or benzocyclobutene. Further examples are described in US 2012/0104537 A1, the content of which is herewith incorporated by reference.

A process for manufacturing a semiconductor device having an edge termination is described next with reference to FIGS. 5 to 11.

A semiconductor substrate 119 having a first side 111, a second side 112, a plurality of laterally spaced semiconductor devices 100 integrated into the semiconductor substrate 119, a first doping region 121 of the second conductivity type, a drift region 122 of the first conductivity type, and a third doping region 123 of the first conductivity type is provided. FIG. 5 illustrates a plans view onto the first side 111 of the semiconductor substrate 119.

Semiconductor substrate 119 can be comprised of a base layer, which later forms the third doping region 123, and an epitaxial layer formed on the base layer. Epitaxial layer would than include the drift region 122 and the first doping region 121. The edge termination 103 will then also be formed in the epitaxial layer.

Semiconductor substrate 119 may also be a homogeneously doped semiconductor wafer of Si, GaN, GaAs, SiC.

In a further process, first and second trenches 138a, 138b are formed in the semiconductor substrate 119 at the first side 111. The first and second trenches 138a, 138b are arranged between adjacent semiconductor devices 100. Each of the first and second trenches 138a, 138b includes two sidewalls 135 and a bottom 136 as illustrated in FIGS. 6A and 6B.

The first trenches 138a run perpendicular to second trenches 138b so that a grid of trenches is formed. The depth of the first and second trenches 138a, 138b corresponds to about half of the vertical extension of the drift region 122 as previously described herein. The first and second trenches 138a, 138b may also be formed deeper or more shallow depending on circumstances. When sufficient semiconductor material is left below the bottoms 136 of the first and second trenches 138a, 138b, the semiconductor substrate 119 remains sufficiently stable so that no additional carrier wafer is needed. However, a carrier wafer onto which the semiconductor substrate 119 is temporarily fixed may also be used.

Figure 6B:
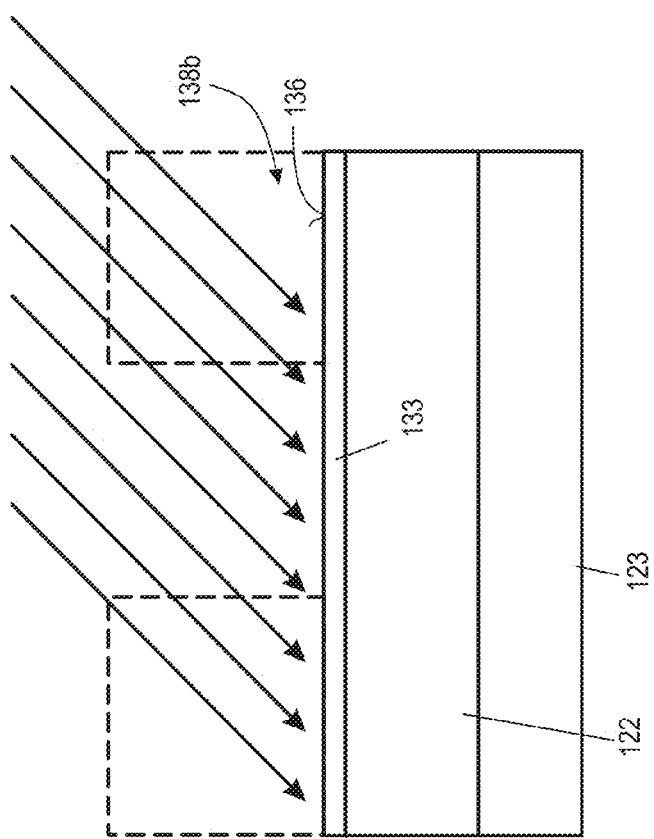
Figure 6A:
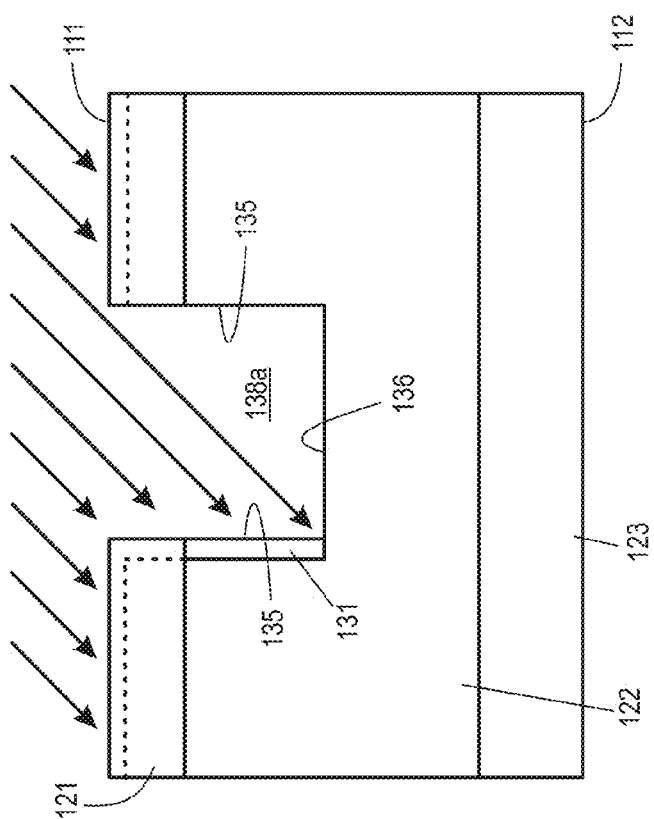
Figure 7B:
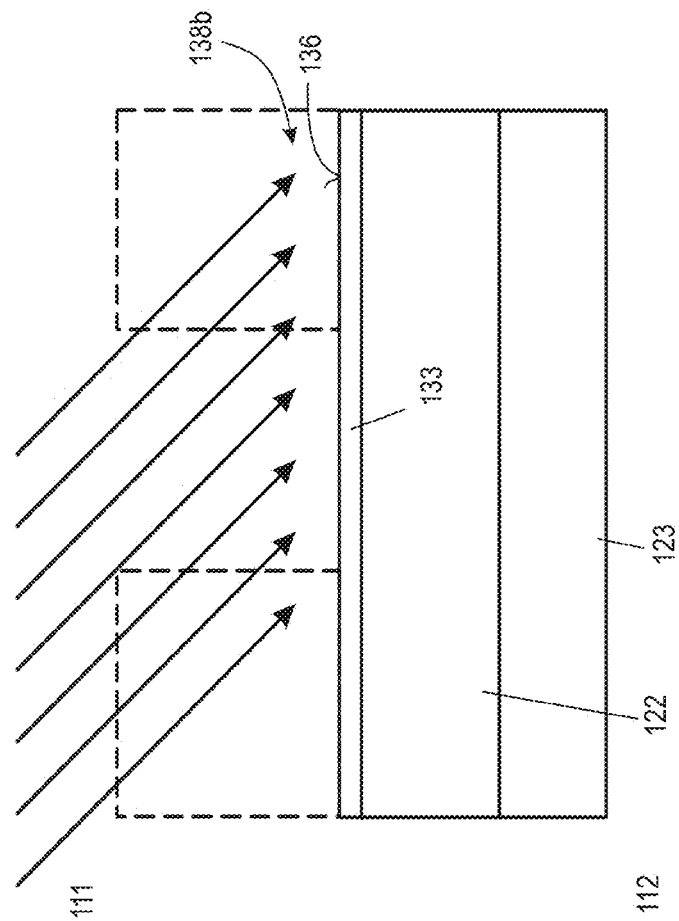
Figure 7A:
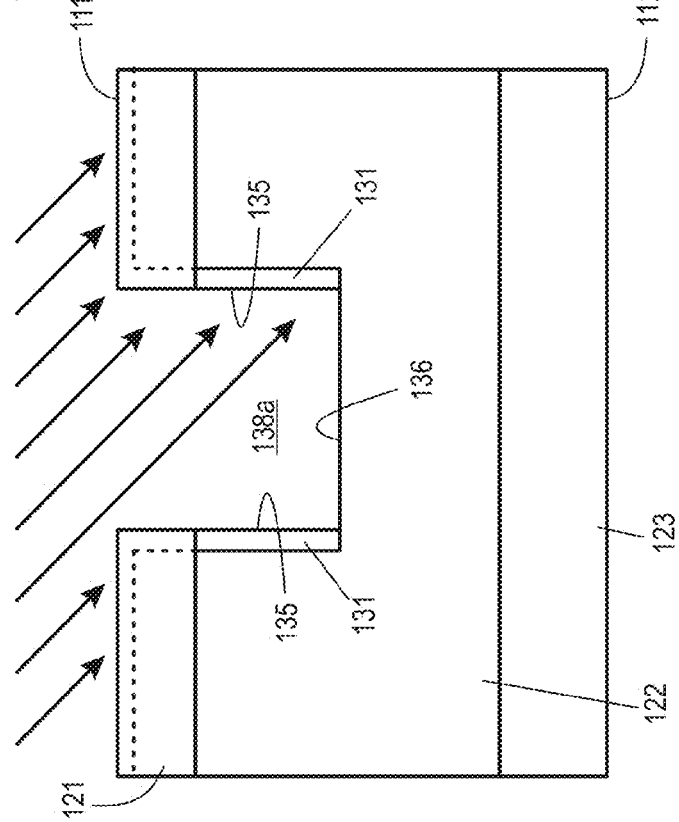

Subsequent implantation processes are illustrated in FIGS. 6A, 6B, 7A and 7B wherein FIGS. 6A and 7A illustrate a vertical cross-section through the semiconductor substrate 119 along line AA' in FIG. 5 and FIGS. 6B and 7B illustrate a vertical cross-section through the semiconductor substrate 119 along line BB' in FIG. 5.

As illustrated in FIG. 6A, first doping zones 131 of a second conductivity type are formed in the semiconductor substrate 119 at least along the sidewalls 135 of the first trenches 138a by using an off-axis implantation process as illustrated by the arrows in FIG. 6A. Since the first trenches 138a run perpendicular to the drawing plane of FIGS. 6A and 6B, the plane of incidence of the dopants is perpendicular to the longitudinal extension of the first trenches 138a. The dopants are therefore implanted into the sidewalls 135 of the first trenches 138a only when the inclination angle is appropriately selected. On the other hand, since the second trenches 138b run parallel to the drawing plane of FIGS. 6A and 6B, the dopants can reach the bottom 136 of the second trenches 138b but not the sidewalls 135 of the second trenches 138b. Hence, the third doping regions 133 are formed along the bottom 136 of the second trenches 138b.

In a further process as illustrated in FIGS. 7A and 7B, dopants are implanted from the other side but in the same plane of incidence as in FIGS. 6A and 6B. As a result, the dopants are implanted into the other sidewall 135 of the first trenches 138a and into the bottom 136 of the second trenches 138b, whereas no dopants are implanted into the bottoms 136 of the first trenches 138a and the sidewalls 135 of second trenches 138b. While there is a double implantation into the bottom 136 of the second trenches 138b, each sidewall 135 of first trenches 138a experiences only a single implantation. As a consequence, the doping concentration at the bottom 136 of the second trenches 138b is higher than at the sidewalls 135 of the first trenches 138a by a factor of about 2. The actual doping ratio also depends on the inclination angle.

The process continues by either rotating the semiconductor substrate 119 by about 90° about its vertical axis or by rotation the plane of incidence by about 90° and then repeating the implantation processes previously described herein. As a consequence, the sidewalls 135 of the second trenches 138b and the bottom 136 of the first trenches 138a are doped to have the previously described doping relation.

The first and third doping zones 131, 133 adjoin each other and form pn-junctions with the drift region 122. For forming the first and third doping zones 131, 133, dopants of a second doping type are used.

The previously described implantation processes may be referred to as Quart-Mode-Implantation. Such implantation includes four processes with fixed inclination angle whereas the semiconductor substrate 119 is rotated by 90° about its vertical axis between the implantation processes.

In a further process as illustrated in FIG. 8, spacers 150a are formed at the sidewalls 135 of the first and second trenches 138a, 138b. As the following processes are identical for the first and second trenches 138a, 138b, they are referred to in the following as trenches 138. The spacers 150a leave a portion of the bottom 136 uncovered.

Second doping zones 132 of the first conductivity type are formed in the semiconductor substrate 119 at the uncovered or exposed portions of the bottom 136 of the trenches 138 using the spacers 150a as implantation mask. More specific, first subzones 132a of the second doping zones 132 are formed at the exposed portions of the bottoms 136. Dopants may also be implanted at the first side 111 of the semiconductor substrate 119. However, the first doping region 121 is highly doped so that no compensation of the conductivity type occurs at the first side 111.

In a further process, the spacers 150a are partially etched back to increase the exposed portions at the bottom 136 of the trenches 138. The thus formed spacers 150b are illustrated in FIG. 9. Further subzones 132b of the second doping zones 132 are formed using a further implantation process as illustrated in FIG. 9. Since dopants are also implanted into the subzone 132a, its doping concentration is higher than the doping concentration of the subzones 132b.

The previously described spacer etching and implantation process can be repeated using a further partial etch of the spacers 150b to further increase the exposed portions at the bottom 136 of the trenches 138 and to form further subzones of the second doping zones 132.

For forming the second doping zones 132 including their subzones 132a and 132b, dopants of a first doping type are used. The second doping zones 132 adjoin the drift region 122 as previously described herein and functions as channel stopper.

Figure 10:
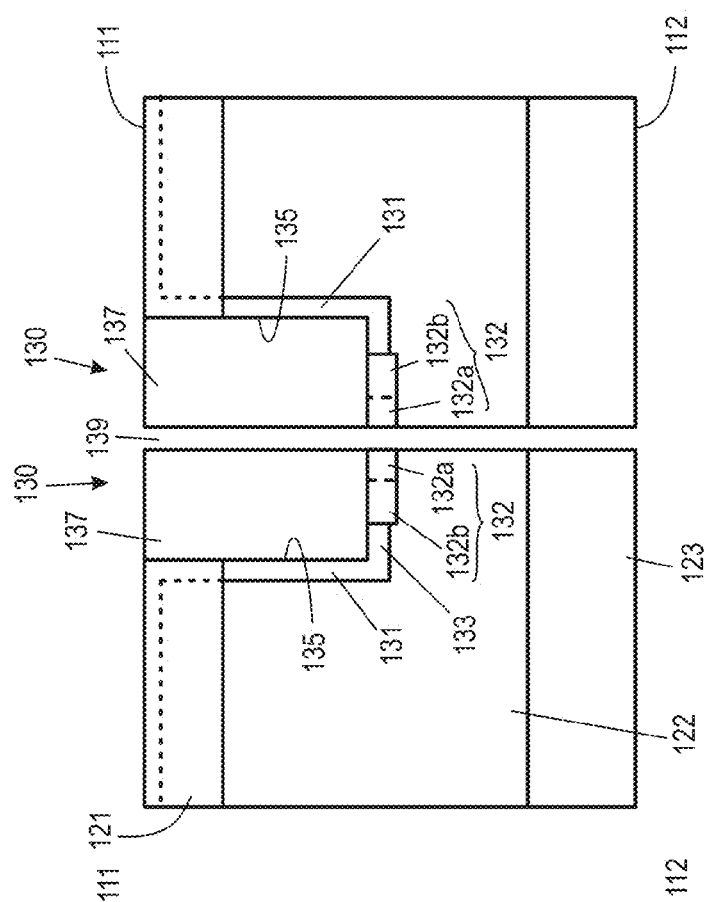

After removing the spacers 150b, the trenches 138 are filled with an insulating material 137 as illustrated in FIG. 10. An optional passivation region 170 can be formed on the bottom 136 and the sidewalls 135 of the trenches 138, as for example shown in FIG. 12, before filling the trenches 138 with the insulating material 137.

Figure 11:
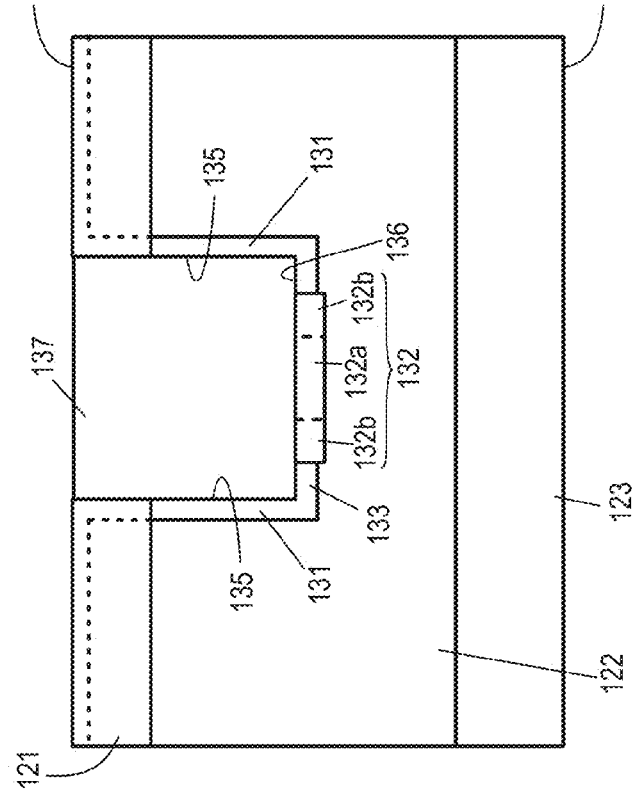

In a further process, as illustrated in FIG. 11, the semiconductor substrate 119 is cut at 139 along the second doping zones 132 in the trenches 138 to separate the semiconductor devices 100. As a result, an edge termination 103 having a step 130 is formed at each lateral edge 113 of the semiconductor devices 100 as previously described herein. It is beneficial to form the trenches 138 along the so-called separation lines or sawing lines along which the semiconductor devices 100 are finally separated so that the structure of the step 130 is automatically formed when cutting the semiconductor substrate 119.

Since the separation occurs along the trenches 138, the resulting edge termination 103 is arranged at the periphery of the thus formed semiconductor device 100 and laterally surrounds the active area of the semiconductor device 100.

First and second metallization 141, 142 may be formed before cutting the semiconductor substrate 119. The first metallization 141, or parts thereof, may also function as field plate as previously described herein and covers the edge termination 103. Furthermore, an optional passivation layer 129 can be formed on the first side 111 of the semiconductor substrate 119 above the insulating material 137 and partially on the first and second metallizations 141, 142 before cutting the semiconductor substrate 119.

Figure 12:
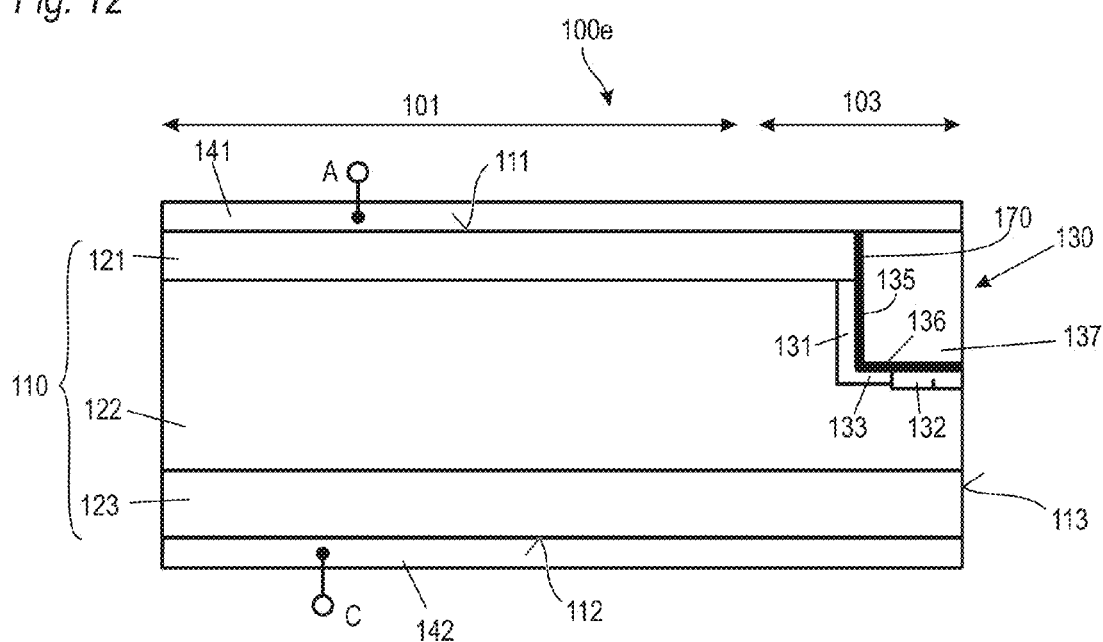
FIG. 12 illustrates a two-terminal power device having an edge termination with a channel stopper at a bottom of a trench according to an embodiment.

The resulting structure is illustrated in FIG. 12 which shows a power semiconductor diode. First metallization 141 extends up to the lateral edge 113 and functions also as field plate in this region. First metallization 141 also forms an anode terminal denoted by "A". Second metallization 142 also completely covers the second side 112 and forms a cathode terminal denoted by "C". The semiconductor device 100e of FIG. 12 is an example of a two-terminal device.

Figure 13:
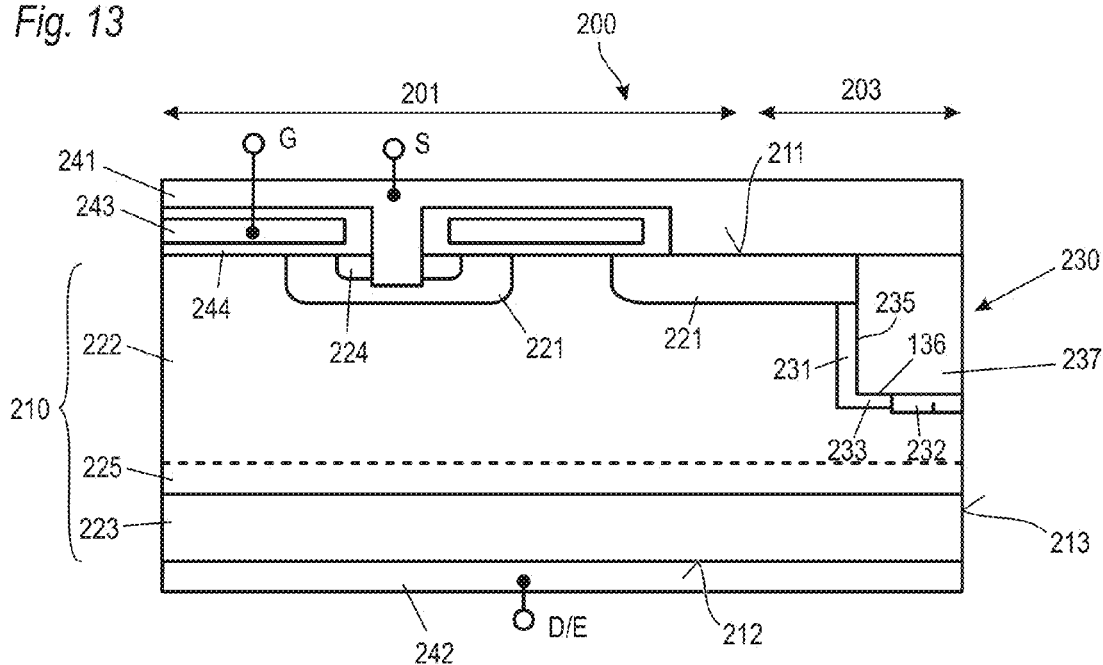
FIG. 13 illustrates a three-terminal power device having an edge termination with a channel stopper at a bottom of a trench according to an embodiment.

The previously described edge termination 103 is not restricted to two-terminal devices and can also be integrated into IGBTs and power-FETs. FIG. 13 illustrates a semiconductor device 200 embodied as IGBT. This is an example of a three-terminal device. The IGBT 200 includes a semiconductor body 210 having a first side 211, a second side 212 opposite the first side 211, an active area 201, an edge termination 203, and a lateral edge 213. Integrated into the semiconductor body 210, there are a first doping region 221 of the second conductivity type which forms a body region of the IGBT, a second doping region 222 of the first conductivity type which forms a drift region of the IGBT, a third doping region 223 of the second conductivity type which forms an emitter region of the IGBT, and a fourth doping region 224 which forms a source region of the IGBT. An optional field stop region 225 of the first conductivity type may also be integrated next to the emitter region 223. The field stop region 225 has a higher doping concentration than the drift region 222.

A gate electrode 243 is arranged at the first side 211 of the semiconductor body 210 and insulated from the semiconductor body 210 by a gate dielectric 244. Gate electrode 243 is connected with a gate terminal G.

A first metallization 241 forms a source metallization and is arranged at the first side 211 of the semiconductor body 210 in ohmic contact with the source and body regions 221 and 224. The first metallization 241 forms a source terminal denoted by "S".

A second metallization 242 which forms an emitter metallization is arranged at the second side 212 of the semiconductor body 210 in ohmic contact with the emitter region 242. The second metallization 242 forms an emitter terminal denoted by "E".

The edge termination 203 includes a step 230 having a lateral sidewall 235 along which a first doping zone 231 of the second conductivity type is formed. The step 230 may have a structure as previously described herein. The first doping zone 231 adjoins the body region 221 arranged at the first side 211 of the semiconductor body 210. A third doping region 233 of the second conductivity type is formed at a bottom 236 of the step 230 and adjoins the first doping zone 231. A second doping zone 232 of the first conductivity type is formed at the bottom 236 of the step 230 and extends up to the lateral edge 213. The step 230 is filled with an insulating material 237.

The first metallization 241 can extend up to the lateral edge 213 and at least partially covers step 230 so that an extended first metallization 241 is formed to improve heat dissipation. The second metallization 242 also extends up to the lateral edge 213.

The third doping region 223 may also be of the first conductivity type, i.e. can be of the same conductivity type as the drift region 222 and the optional field stop region 225. In this case, the semiconductor device 200 is a power-FET and the third doping region 223 forms a drain region of the power-FET. The second metallization 242 will then form a drain terminal as denoted by "D".

The first, second and third doping zones 231, 232, and 233 can be formed and can have doping relations as previously described herein.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
  a semiconductor body comprising a first side, a second side, a lateral edge delimiting the semiconductor body in a lateral direction, an active area, and an edge termination arranged between the active area and the lateral edge;
  a drift region of a first conductivity type formed in the semiconductor body;
  the edge termination comprising:
    a step formed in the semiconductor body between the first side of the semiconductor body and the lateral edge, the step comprising a lateral surface extending up to the first side of the semiconductor body and a bottom surface extending up to the lateral edge of the semiconductor body;
    a first doping zone of a second conductivity type formed in the semiconductor body along the lateral surface of the step and forming a pn-junction with the drift region; and
    a second doping zone of the first conductivity type formed in the semiconductor body at least along a part of the bottom surface of the step and extending up to the lateral edge of the semiconductor body, the second doping zone being in contact with the drift region.

2. The semiconductor device according to claim 1, further comprising a first doping region of the second conductivity type formed in the semiconductor body and forming a pn-junction with the drift region, wherein the first doping region adjoins the first doping zone.

3. The semiconductor device according to claim 1, further comprising an insulating material filled in the step, wherein the insulating material laterally extends up to the lateral edge of the semiconductor body.

4. The semiconductor device according to claim 3, further comprising a passivation layer covering the insulating material at the first side of the semiconductor body.

5. The semiconductor device according to claim 1, wherein the drift region has a vertical extension and wherein the step vertically extends from the first side of the semiconductor body to a depth of about half of the vertical extension of the drift region.

6. The semiconductor device according to claim 1, further comprising a third doping zone of the second conductivity formed in the semiconductor body along a part of the bottom surface of the step and extending up to the lateral surface of the step, the third doping zone wherein a pn-junction with the drift region and adjoining the first doping zone.

7. The semiconductor device according to claim 6, wherein the third doping zone has a doping concentration which is higher than a doping concentration of the first doping zone.

8. The semiconductor device according to claim 1, wherein the second doping zone has a laterally varying doping concentration.

9. The semiconductor device according to claim 8, wherein the doping concentration of the second doping zone increases toward the lateral edge.

10. The semiconductor device according to claim 1, further comprising a field plate arranged on the first side of the semiconductor body and at least partially covering the step.

11. The semiconductor device according to claim 2, further comprising a field plate arranged on the first side of the semiconductor body and being in electrical contact with the first doping region, the field plate at least partially covering the step.

12. The semiconductor device according to claim 1, further comprising a passivation region on the lateral surface and bottom surface of the step between the semiconductor body and the insulating material.

13. The semiconductor device according to claim 1, further comprising a vertical field plate along the lateral edge of the semiconductor body.

14. A semiconductor device, comprising:
  a semiconductor body comprising a first side, a second side, a lateral edge delimiting the semiconductor body in a lateral direction, an active area, and an edge termination arranged between the active area and the lateral edge;

a drift region of a first conductivity type formed in the semiconductor body;

the edge termination comprising:

a step formed in the semiconductor body between the first side of the semiconductor body and the lateral edge, the step comprising a lateral surface extending up to the first side of the semiconductor body and a bottom surface extending up to the lateral edge of the semiconductor body;

a first doping zone of a second conductivity type formed in the semiconductor body at the lateral surface of the step and forming a pn-junction with the drift region;

a second doping zone of the first conductivity type formed in the semiconductor body along a part of the bottom surface of the step and extending up to the lateral edge of the semiconductor body, the second doping zone being in contact with the drift region;

a third doping zone of the second conductivity formed in the semiconductor body at the bottom surface of the step and extending up to the lateral surface of the step, the third doping zone forming a pn-junction with the drift region and adjoining the first doping zone, wherein the third doping zone has a doping concentration which is higher than a doping concentration of the first doping zone;

an insulating material filling the step, covering the first, second and third doping zone and extending up to the lateral edge of the semiconductor body.

15. The semiconductor device according to claim 14, wherein the second doping zone has a laterally varying doping concentration.

16. The semiconductor device according to claim 14, further comprising a lateral field plate arranged on the first side of the semiconductor body and at least partially covering the step.

* * * * *